United States Patent [19]

Miyazaki et al.

[11] Patent Number: 5,008,586
[45] Date of Patent: Apr. 16, 1991

[54] SOLID STATE CURRENT SENSING CIRCUIT AND PROTECTION CIRCUIT

[75] Inventors: Hideki Miyazaki; Akihiko Kanouda; Kenichi Onda; Yasuo Matsuda, all of Hitachi, Japan

[73] Assignee: Hitachi, Ltd., Tokyo, Japan

[21] Appl. No.: 302,340

[22] Filed: Jan. 27, 1989

[30] Foreign Application Priority Data

Jan. 29, 1988 [JP] Japan ................... 63-16971

[51] Int. Cl.$^5$ ............................ G05F 1/56; G05F 3/26
[52] U.S. Cl. ................................ 323/315; 323/316; 361/93
[58] Field of Search ................ 323/315, 316, 317; 361/93, 100

[56] References Cited

U.S. PATENT DOCUMENTS

| 4,435,678 | 3/1984 | Joseph et al. | 323/281 |
| 4,567,537 | 1/1986 | Kalkhof | 361/98 |
| 4,739,246 | 4/1988 | Thompson | 323/316 |
| 4,792,750 | 12/1988 | Yan | 323/315 |
| 4,820,968 | 4/1989 | Wrathall | 323/316 |

FOREIGN PATENT DOCUMENTS

| 107028 | 5/1984 | European Pat. Off. |  |
| 208618 | 11/1984 | Japan | 323/316 |
| 85/03818 | 8/1985 | World Int. Prop. O. |  |

OTHER PUBLICATIONS

Taub, "Current Threshold Circuit," IBM Tech. Discl. Bul., vol. 17, No. 3, p. 750, Aug. 1974.

Primary Examiner—William H. Beha, Jr.
Attorney, Agent, or Firm—Antonelli, Terry, Stout & Kraus

[57] ABSTRACT

A current sensing circuit for sensing a main current flowing through a power semiconductor element or elements, by utilizing a second current which is small in magnitude compared to the main current and varies depending on the main current, and sensing the second current through a current mirror circuit as a bias current of a differential circuit, and a function of sensing the temperature of the semiconductor element being afforded to the current sensing circuit through selection of a bias voltage.

7 Claims, 9 Drawing Sheets

SOLID STATE CURRENT SENSING CIRCUIT AND PROTECTION CIRCUIT

BACKGROUND OF THE INVENTION

This invention relates to a power semiconductor device and more particularly to a current sensing circuit adapted for a power IC which integrates a control circuit and an output stage element of a high withstand voltage and a heavy current and to a protection circuit for such a power IC.

Conventionally, in the circuits utilizing power semiconductor elements, for preventing the power semiconductor elements from being destroyed by an excess current or a short-circuiting, there is known a method of detecting the current through the power semiconductor element with the use of a shunt resistor through the voltage drop across the resistor. In a power IC integrating a power semiconductor element of a high withstand voltage and a heavy current and a control circuit for controlling the power semiconductor element, however, the above-mentioned method of using a shunt resistor causes a problem of heat generation due to the power loss and hence cannot be employed.

The output stage element of a power IC may be a bipolar transistor of the current drive type, a MOSFET of the voltage drive type, and a composite element co-using a MOS structure and a bipolar structure. When bipolar transistors are connected in parallel, it is generally known that there occurs unbalance of currents flowing through the respective transistors, i.e. the so-called current concentration. A current detecting circuit utilizing this current is such a structure disclosed in U.S. Pat. No. 4,139,181. This structure is reproduced in FIG. 1. In the circuit of FIG. 1, the output stage employs multi-collector PNP transistors 52 and 53. The emitter of the transistor 52 is connected to the positive electrode of a voltage source 13, while the emitter of the transistor 53 is connected to the positive electrode of the voltage source 13 through a resistor 54. The base terminals of the transistors 52 and 53 are applied with the same driving signal from the control circuit 59. Numerals 62 and 63 denote substrate collectors which supply currents to a load 14. Numerals 60 and 61 denote lateral collectors which are connected respectively with MOSFETs 56 and 55 forming a current mirror circuit. The ratio of areas of the MOSFETs 55 and 56 is 1:n.

Next, the operation of the circuit will briefly be described. Letting the current flowing through the lateral collector 61 be $I_7$, the MOSFET 56 will have a function of possibly flowing a current of $nI_7$ by the function of the current mirror circuit. Letting the current flowing through the lateral collector 60 be $I_8$, a relation of $nI_7 > I_8$ holds when the voltage drop across the resistor 54 is small. The output voltage derived at a point 64 is of low level. Next when the current flowing through the load 14 increases to increase the voltage drop across the resistor 54, the current is more concentrated in the transistor 52 to produce a situation $I_8 > nI_7$. As a result, the output voltage derived at point 64 changes to a high level.

By the above-described operation, the lateral collector current exceeding a set value is detected and the current flowing through the substrate collectors to the load is indirectly detected to exceed an excess current level.

In contrast to the above-described method, U.S. Pat. No. 4,553,084 proposes a method of utilizing a MOSFET as the output stage element, the MOSFETs being superior in the current balance when connected in parallel.

According to this method, utilizing the fact that the power MOSFET of the output stage element comprises an integrated parallel connection of a multiplicity of small-capacity MOSFETs, which are called cells, a few or several cells used as a detecting transistor and a resistor is connected to this detecting transistor.

When the voltage drop across the resistor connected to the detecting transistor is small, the detecting transistor allows such a detection current to flow which is determined by the cell ratio with respect to the main current flowing through the power MOSFET of the output stage. The voltage produced by this detection current and the above-mentioned resistor is compared with a reference voltage, to detect the main current indirectly.

According to the former prior art utilizing multi-collector PNP transistors, it is difficult to precisely set the reference current $I_7$ because of the dispersion in the precision of the resistor 54 and of the variation of the resistance by the temperature rise.

Further, although it is required that the currents flowing through the lateral collector and through the substrate collector are in a proportional relation, occurrence of current concentration can occur in a bipolar transistor and the precision of the indirect current detection becomes of problem. Further, the MOSFETs 55 and 56 connected in parallel to the load 14 are both required to have a high withstand voltage, which means being expensive.

According to the latter prior art utilizing the MOSFET as the output stage element, the structure is simple and the precision of detection is good at the room temperature. At the high temperature, the resistance value changes to give influence to the detection precision. Further, when the resistor is integrated in the semiconductor substrate, there are also problems such as the dispersion of resistances due to the manufacturing process.

In a power IC, various other protection functions are required such as assurance of operation of the output stage element in the area of safety operation (ASO), protection from the temperature and the excess voltage, and protection from the arm short-circuiting in the case when the output stage element has an inverter construction, as well as the protection from the excess current. Each of the above-mentioned prior art only applies to the protection function for the excess current, and other circuit means are required to be installed for achieving other protection functions.

SUMMARY OF THE INVENTION

An object of this invention is to provide a current sensing circuit for a semiconductor element which solves the above-mentioned problems and is hardly influenced by the temperature changes, dispersions in the manufacture characteristics.

Another object of this invention is to provide a current sensing circuit which can detect also various states of an element as well as the current in a multi-functional way.

Further object of this invention is to provide a protection circuit for a semiconductor element capable of effectively protecting the semiconductor element according to the state of the element.

A feature of this invention lies in comprising means for deriving a current which changes in accordance with a load current flowing through an output stage element as a sensing current, means for setting a reference current, and current comparison means for comparing the sensed current with the reference current, whereby current sensing with less temperature dependence is enabled by comparing current itself.

Another feature of this invention lies in that the element current is taken out in the form of a current, the element temperature is taken out in the form of a voltage, a reference current and a reference voltage are set, and these element current and voltage and the reference current and voltage are compared to realize multi-functional state sensing, further by performing these comparisons in a differential amplifier circuit, the functions of current sensing and temperature sensing are achieved by a single differential amplifier circuit.

Further feature of this invention lies in the provision of means for cutting off the current through a semiconductor element when a current changing the magnitude in dependence on the state of the element exceeds a reference current, thereby achieving a protection circuit of a semiconductor element, the temperature dependence of which is small.

Further, in the embodiments of this invention, many expedients are employed in such points as sensing of the element current, dispositions of a current sensing circuit and a protection circuit, application to an inverter circuit, simplification of the circuit, etc. which will be described in detail in connection with the embodiments.

In a current sensing circuit according to this invention, the output of the current comparison means becomes a high level voltage in the state where the reference current is large compared to the sensed current, and becomes a low level voltage when the load current exceeds a desired operation range and the sensed current becomes large compared to the reference current. In this way, the method of discriminating a sensed current by the current comparison can improve the temperature dependency of the sensing precision compared to the conventional voltage comparison method which converts a current to be sensed into a voltage by using a resistor and compares this voltage with a reference voltage, since a resistor which changes its value in dependence on the temperature is not used. Further, by changing the sensed current which changes depending on the load current to a current which changes depending on the temperature rise, the temperature sensing using the similar current comparison function becomes possible.

Next, multi-functional state sensing is made possible by comparing a sensed current which varies in dependence on the current through the semiconductor element and a sensed voltage which changes in dependence on the temperature of the element with a reference current and a reference voltage. Especially, when a differential amplifier circuit is used and the above-mentioned sensed current is used as the bias current of the circuit, in a state near the room temperature only one side of the differential amplifier circuit is made conductive from the difference of the input voltages. Here, by setting the relation of the bias current setting means of the differential amplifier circuit with the active load to be the structure of the above-mentioned current comparison means, current sensing function works in the state at the room temperature. When the temperature rises significantly, the difference of the input voltages to the differential amplifier circuit means changes to cut off the one side of the differential amplifier circuit which has been conducting in the room temperature state, and to turn on the other side. When the change in the output voltage in the side which has been turned on at this time is detected, excessive rise of the temperature can be detected. In this way, a multi-functional state sensing means can be realized with a single differential amplifier circuit.

Further, since the element state is judged using a current which has small temperature dependence to cut off the current conduction through that element, the reliability of the protection circuit can be raised.

Hereinbelow in the embodiments, the element state is exempplified as the current and the temperature. Development can be made to other ones such as the detection of deterioration of the element.

DESCRIPTION OF THE PREFERRED EMBODIMENTS

Figure 1:
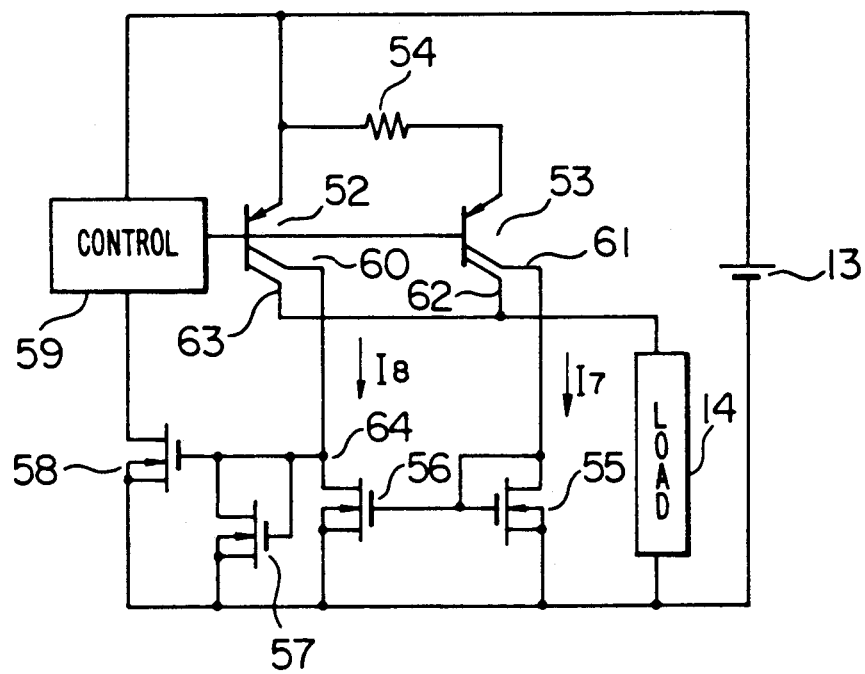
FIG. 1 is a circuit diagram of a conventional current sensing circuit.
Figure 2:
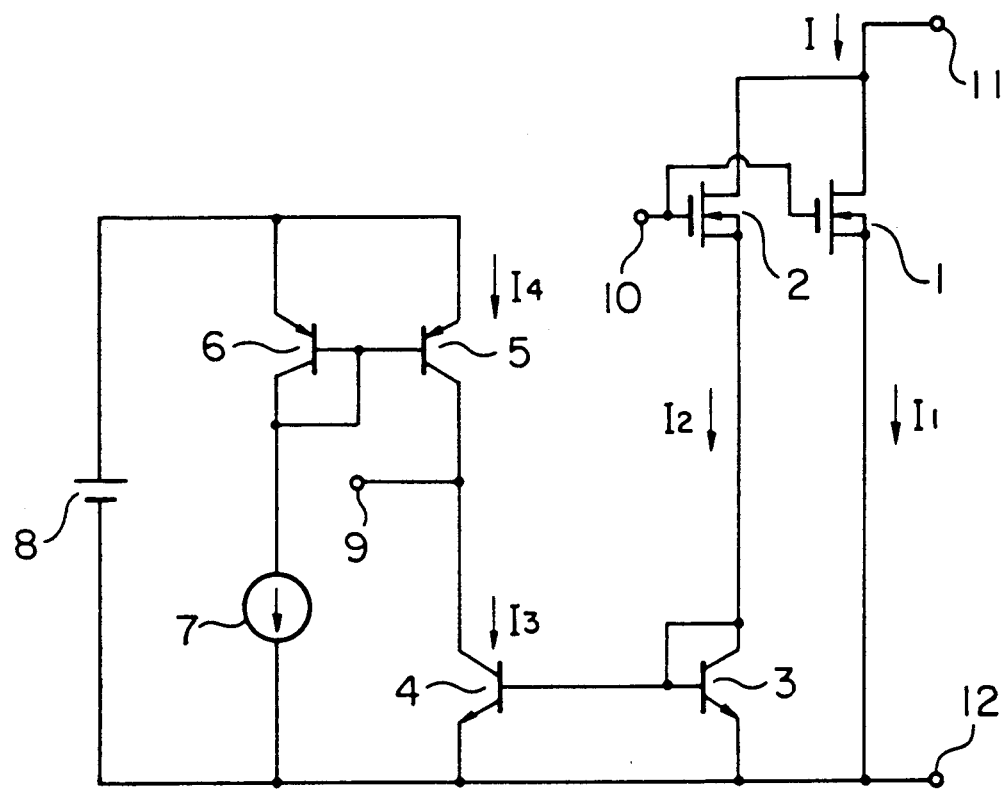
FIG. 2 is a circuit diagram of a first embodiment of the current sensing circuit for a semiconductor element according to this invention.

An embodiment of this invention will be described referring to FIG. 2. In FIG. 2, a power semiconductor element 1 is formed of a MOSFET, but may be formed of another voltage-drive type element. To the power semiconductor element 1, an input terminal 11, an output terminal 12, and a control terminal 10 are connected. To the power semiconductor element 1, a small capacity semiconductor element 2 having the same characteristics and co-using the input terminal 11 and the control terminal 10 is connected. The current I flowing through a load (not shown) is divided into a main current $I_1$ flowing through the power semiconductor element and a current $I_2$ flowing through the semiconductor element 2. Here, the semiconductor element 2 has the same withstand voltage and a smaller current capacity compared to the power semiconductor element 1.

The above-described construction is a publicly known art. It is similar to the multi-electrode transistor. The current sensing circuit of this embodiment is fitted to the above-described construction.

Hereinbelow, the structures featuring the present embodiment will be shown. The output terminal of the semiconductor element 2 is connected to the collector and the base terminals of an NPN transistor 3. The base terminal of the transistor 3 is connected to the base terminal of another transistor 4. Thus, the transistors 3 and 4 constitute a so-called current mirror circuit. As a result, the transistor 4 has a function of being capable of flowing a current $I_3$ proportional to the current $I_2$ flowing through the transistor 3. Here, the transistors 3 and 4 need to be identical in the characteristics per unit area. Further, although bipolar transistors are used in the figure, MOSFETs can also be used.

Next, to the collector terminal of the transistor 4, the collector terminal of a PNP transistor 5 is connected. An output 9 is derived from the interconnection point. PNP transistors 5 and 6 constitute a current mirror circuit. The transistor 6 allows a current set by a constant current source means 7 to flow, and the transistor 5 has a function of being capable of flowing a reference current $I_4$ proportional to the above-mentioned current. Also, the transistors 3 and 4 and a voltage source 8 form a closed circuit.

Next, the operation of this circuit will be described. First, the current $I_2$ divided from the load current I is obtained as, $$I_2 = R_1/(R_1 + R_2 + R_3) \cdot I \quad (1)$$

Here, $R_1$, $R_2$ and $R_3$ are on-resistances of the semiconductor elements 1, 2 and the transistor 3.

Next, the current $I_3$ which the transistor 3 can flow by the function of the current mirror circuit constituted of the transistors 3 and 4 is obtained by the following equation.

$$I_3 = nI_2 \quad (2)$$

Here, the constant n represents the ratio of area of the transistor 4 with respect to that of the transistor 3.

For allowing the current $I_2$ and $I_3$ to flow, it is needed for the voltage at the control terminal of the transistor 3 to exceed the threshold value. This threshold value depends on the transistor used. In the case of a bipolar transistor, it is the forward voltage drop (about 0.7 V) for allowing a junction having a diode property to become conductive. In the case of a MOSFET, it is the generally used threshold voltage $V_{th}$.

When the above-mentioned current $I_3$ is small compared to the reference current $I_4$ flowing through the transistor 5, the voltage of the output 9 takes a high level near the voltage of the voltage source 8. On the contrary, when the current $I_3$ is large compared to the current $I_4$, the output voltage 9 takes a low level near the on-voltage of the transistor 4.

When it is desired to impose a limitation to the load current I, a current $I_3$ for this limitation is obtained from these equations (1) and (2), and the set value of the reference current $I_4$ is set equal to the obtained $I_3$, then it becomes possible to sense the variation of the output 9 from the above-described circuit operation and to impose limitation to the load current.

As is described above, this embodiment may be featured by comprising the current comparison means formed of the transistors 4 and 5 for comparing a sensed current and a reference current. This current comparison means has an advantage that the structure becomes simple compared to a voltage comparison means including a differential amplifier, etc. Further, when a voltage comparison means as described in the prior art section is used, it is necessary to convert a current to be sensed into the form of a voltage using a resistor means. The resistor means has a high temperature dependence. Thus, the sensing precision becomes worse by the influence of the temperature change. The current comparison means according to this invention does not use a resistor means, and the current detection is performed by a current mirror circuit which has small temperature dependence. Therefore, there is provided an effect that the sensing precision can be improved compared to the above-mentioned prior art.

Figure 3:
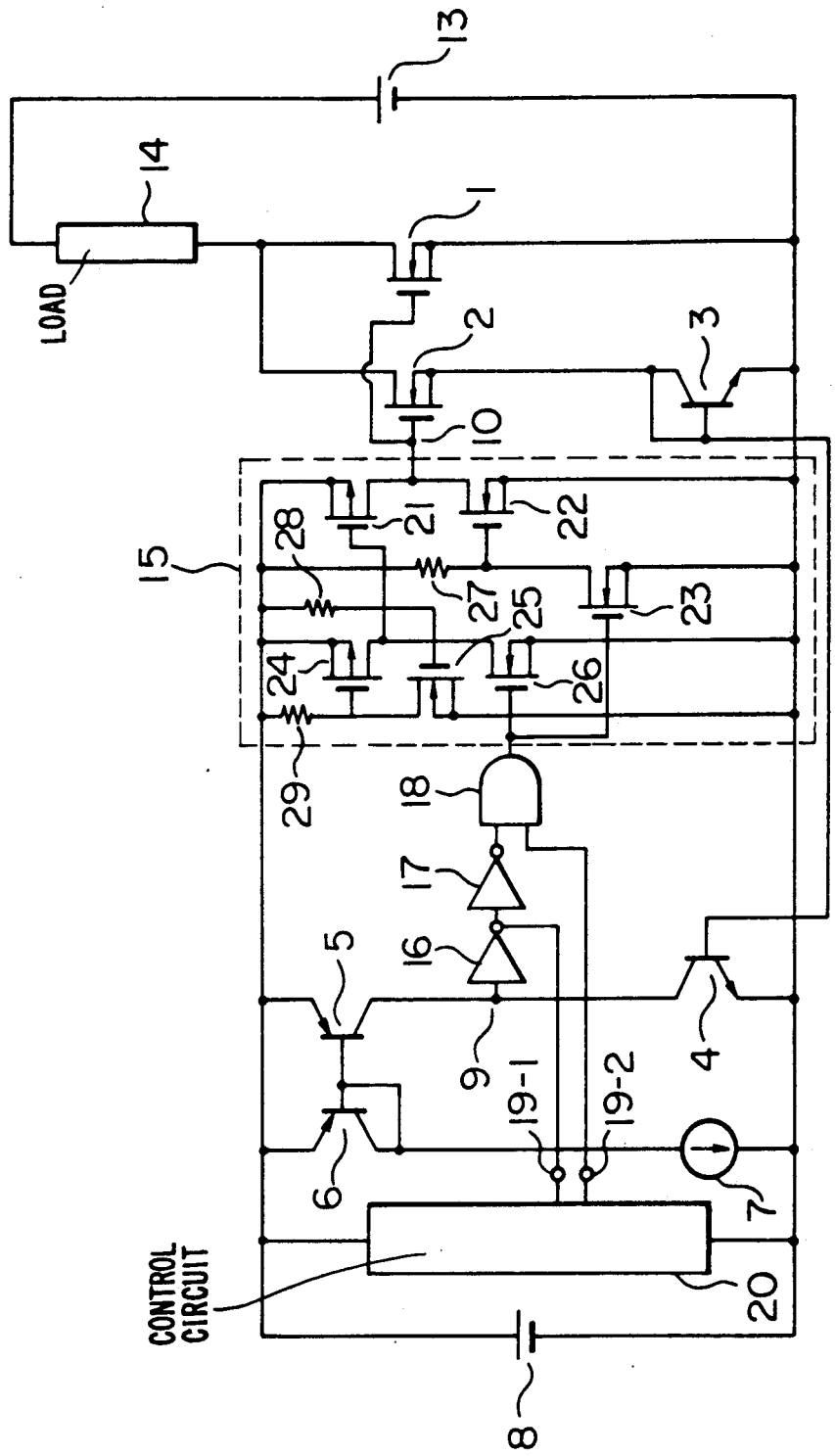
FIG. 3 is a circuit diagram of a second embodiment according to this invention.

FIG. 3 shows a drive circuit for a power semiconductor device provided with an excess current protection function according to this invention. In FIG. 3, to a control terminal 10, a drive circuit 15 is connected which has a function of turning on semiconductor elements (and 2 by applying a high level voltage exceeding the threshold voltage $V_{th}$ to the gate electrodes of N channel MOS transistors 23 and 26, and of turning off the semiconductor elements 1 and 2 by applying a low level voltage lower than the threshold voltage $V_{th}$ to the gate electrodes of the N channel MOS transistors 23 and 26. The transistors 23 and 26 are applied with a voltage from an AND circuit 18. To the AND circuit 18, a drive signal for turning on the semiconductor elements 1 and 2 is applied from a control circuit 20 through a terminal 19-2, and a signal from an output terminal 9 via inverters 16 and 17 is inputted. The output of the inverter 16 is inputted to the terminal 19-1 of the control circuit 20.

With respect to other circuit constructions, the embodiment of FIG. 3 is similar to the embodiment of FIG. 2.

In this embodiment, similar to the embodiment of FIG. 2, when the current flowing through the transistor 4 exceeds the current flowing through the transistor 5 which is set at a desired current value, a voltage near the on-voltage of the transistor 4, i.e. a low level voltage with respect to the above-mentioned $V_{th}$, is inputted to the inverter 16 from the output 9. As a result, the output voltage from the AND circuit 18 becomes of low level to turn off the semiconductor elements 1 and 2. By the above-described function, protection from the excess current can be performed.

Figure 4:
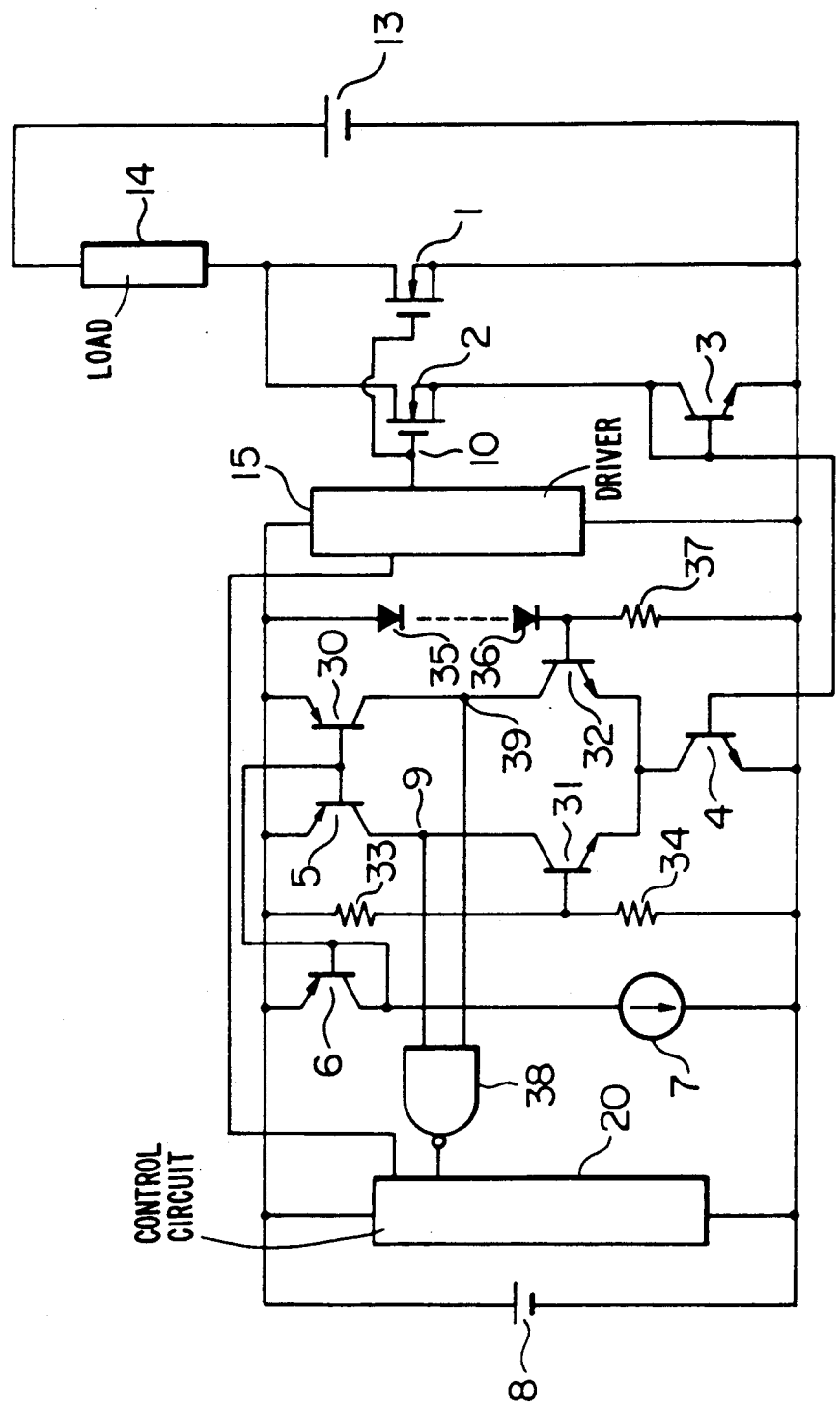
FIG. 4 is a circuit diagram of a third embodiment according to this invention.

FIG. 4 shows another embodiment of this invention. FIG. 4 shows a drive circuit for a semiconductor device provided with a temperature protection function, in addition to the excess current protection function shown in FIG. 3.

A voltage source 13, a load 14, semiconductor elements 1 and 2, transistors 3 and 4 and a drive circuit 15 have similar constructions as shown in the embodiment of FIG. 2, and the explanations thereof are dispensed with. To the collector terminal of the transistor 4, emitter terminals of transistors 31 and 32 constituting a differential amplifier circuit are connected. Between the respective collector terminals of the transistors 31 and 32 and the voltage source 8, transistors 5 and 30 which serve as active loads are connected. The transistors 5 and 30 form the respective current mirror circuits with the transistor 6 and have functions of being capable of allowing currents respectively proportional to the current set by the current source 7.

To the base terminal of the transistor 31, a bias voltage formed by resistors 33 and 34 is applied. This bias voltage will be referred to as bias voltage 1, hereinbelow. The bias voltage 1 is a constant voltage not dependent on the temperature. To the base terminal of the transistor 32, a bias voltage formed by diodes 35 and 36, and a resistor 37 is applied. This bias voltage will be referred hereinbelow as bias voltage 2. The bias voltage 2 is sufficiently smaller than the bias voltage 1 in the room temperature state, and shows a change to become larger than the bias voltage 1 in the state where the semiconductor elements 1 and 2 will be led to destruction by the temperature rise.

Among the two outputs from the differential amplifier circuit means, the output on the side of the transistor 31 is derived from 9 and the other output on the side of the transistor 32 is derived from 39. The both output voltages are input to a NAND circuit 38.

Now, the operation of this embodiment will be described. First in the case where the bias voltage 1 is sufficiently large compared to the bias voltage 2, the transistor 31 is turned on while the transistor 32 is turned off. Here, similar to the embodiment of FIG. 3, comparison of the current which can flow through the transistor 4 as expressed by the above-mentioned equation (2) with a desired current which is set by the current source 7 and which the transistor 5 can flow is performed. Namely, when the current which the transistor 4 can flow exceeds the current which the transistor 5 can flow, the current flowing through the load is indirectly discriminated as an excessive current and a low level voltage is outputted from the output 9. Here, since the transistor 32 is in the cut-off state, the output 39 is approximately equal to the voltage of the voltage source 8 and the output 39 is a high level voltage.

Next, in the state where the temperature has risen to bring the bias voltage 2 larger then the bias voltage 1 and the transistor 31 is cut off, while the transistor 32 is turned on by the function of the differential amplifier, the output 9 is a high level voltage. When the current which the transistor 30 can flow is designed sufficiently small, the output 39 becomes a low level voltage only when the current which the transistor 4 can flow slightly exceeds said current.

When the output of the NAND circuit 38 becomes of high level, the control circuit 20 discriminates that either of an excess current and a temperature rise has occurred and cuts off the semiconductor elements 1 and 2. As described above, in the structure according to this invention, it is possible to joint the functions of current sensing and temperature sensing.

Figure 5:
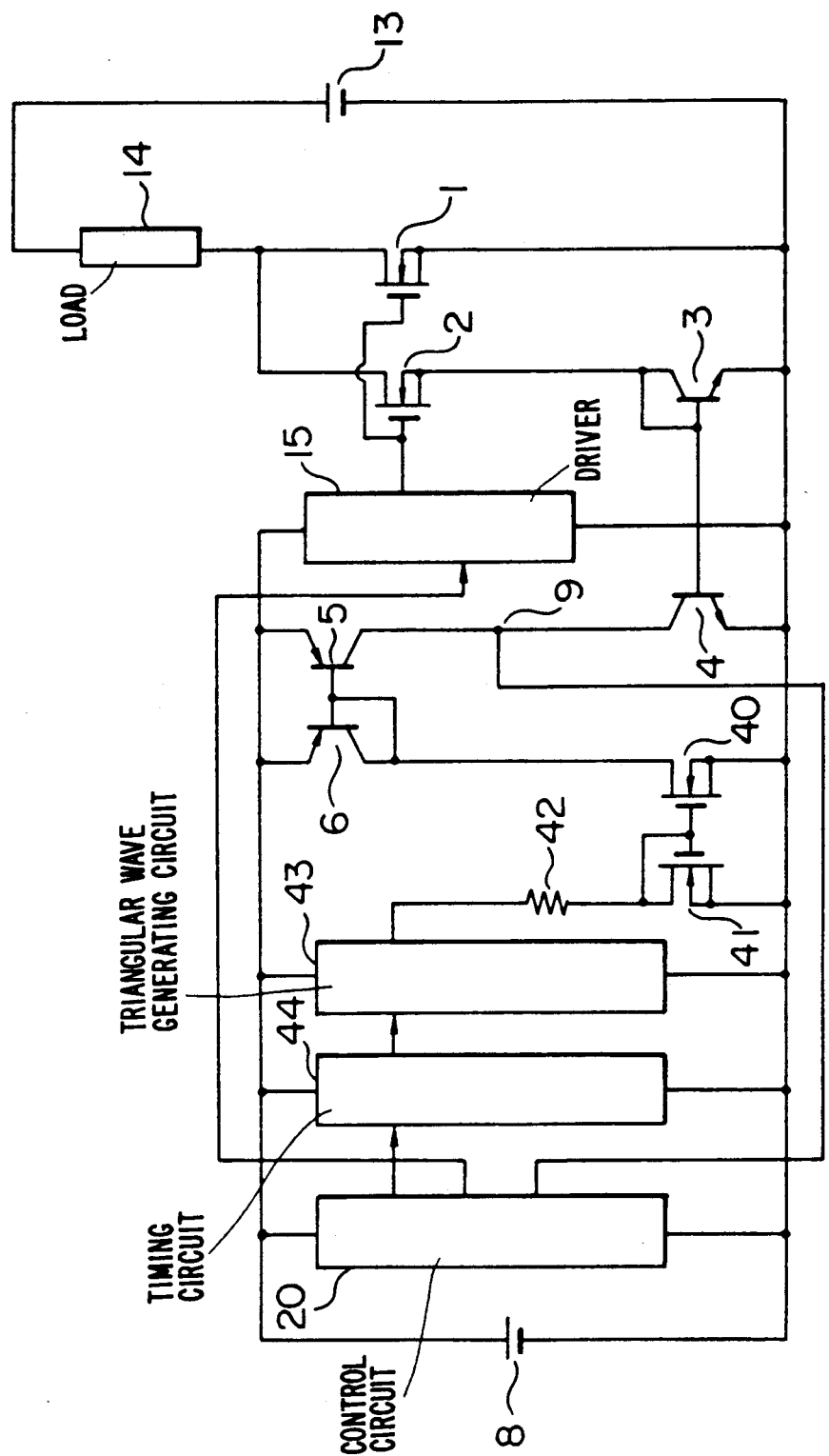
FIG. 5 is a circuit diagram of a fourth embodiment according to this invention.

FIG. 5 shows an embodiment of means for sensing a current for controlling a semiconductor element.

The embodiment shown in FIG. 5 has a similar structure as that of FIG. 3 except the constant current source 7, and the explanations thereof are dispensed with. The difference of FIG. 5 circuit from that of FIG. 3 lies in that triangular waveform voltage having straight rising characteristic is generated using a timing circuit 44, a triangular wave generating circuit 43, a resistor 42 and transistors 40 and 41 constituting a current mirror circuit, in accordance with a predetermined sampling period, and a triangular waveform current determined by this triangular waveform voltage and a resistor 42 is allowed to flow through the transistor 5.

The way of current sensing is similar to that in the embodiment of FIG. 3. Use is made of the change of the voltage of the output 9 from the high level to the low level when the current which the transistor 4 can flow exceeds the current which the transistor 5 can flow. In this embodiment, however, the current which the transistor 5 can flow is a triangular current waveform having a straight rising characteristic. The control circuit 20 can detect the time from the commencement of one sampling period to the time when the current which the transistor 5 can flow becomes small compared to the current which the transistor 5 can flow and hence the voltage of the output 9 changes from the low level to the high level, and can measure the current value corresponding to this time.

Figure 6:
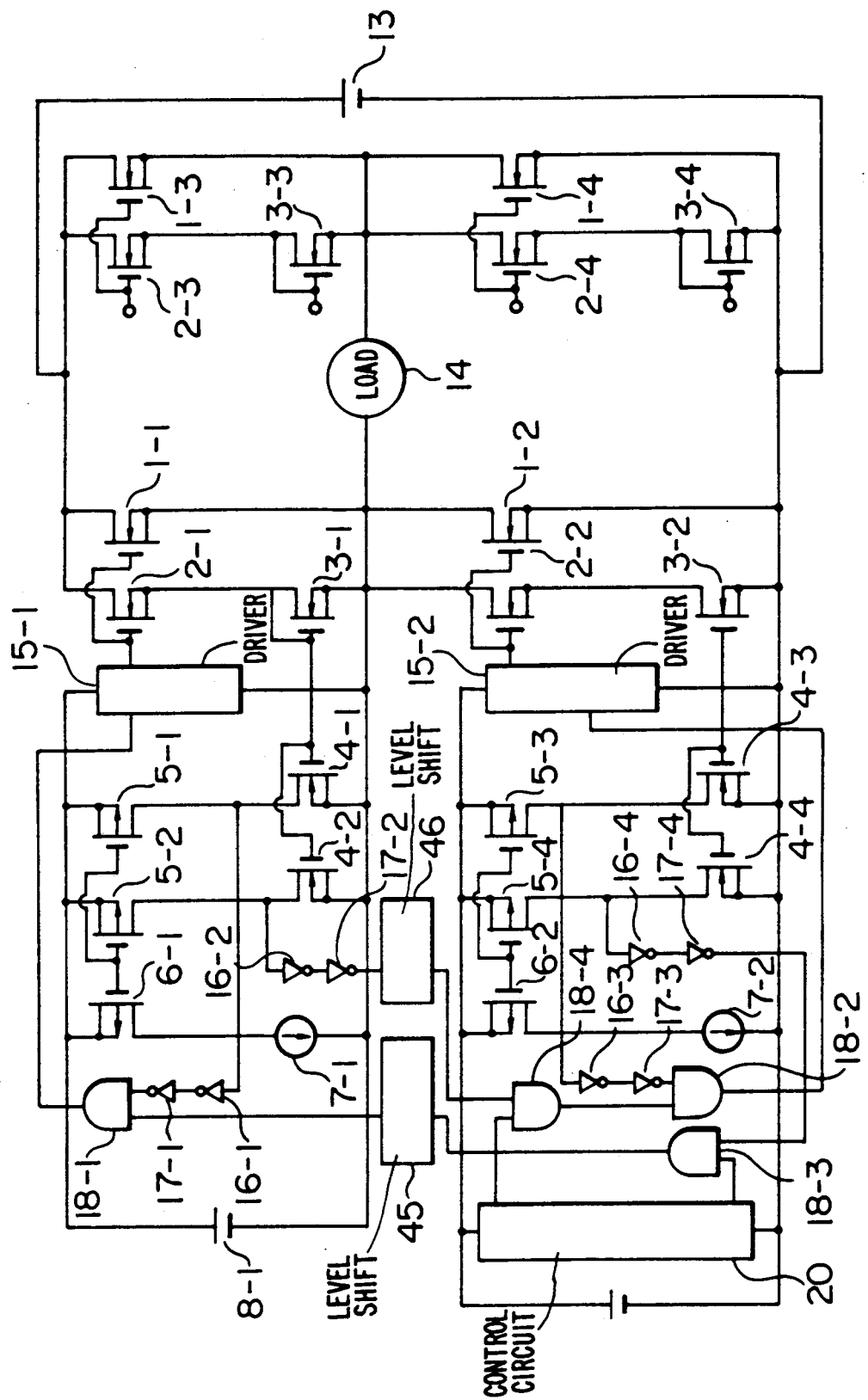
FIG. 6 is a circuit diagram of an embodiment where the invention is applied to an inverter circuit.

FIG. 6 shows an embodiment in which power semiconductor elements 1-1 to 1-4 constitute an inverter of full bridge. This circuit has functions of performing excess current detection of power semiconductor elements on the positive side and on the negative side, respectively, and at the same time of preventing the power semiconductor elements 1-1 and 1-2 and the elements 1-3 and 1-4 to become simultaneously turned on to cause short-circuiting.

In the embodiment of FIG. 6, transistors 3-1, 4-1, 5-1 and 6-1 respectively correspond to the transistors 3, 4, 5 and 6 in the embodiment of FIG. 3, and a function of excess current sensing is provided from the structure of these. In FIG. 6, MOSFETs are used as these transistors, but the role thereof is similar to that of the bipolar transistors in FIG. 3. The use of depletion mode MOSFETs as the transistors 3-1 and 4-1 constitutes a feature of this embodiment, which will be described later.

Since the function of excess current sensing is similar to that of FIG. 3 as described above, the explanations thereof is dispensed with.

Next, the function of preventing short-circuiting will be described. The transistors 4-2 and 5-2 perform the similar function as the current sensing means formed of the transistors 4-1 and 5-1, but the transistor 5-2 is designed small in area and hence has a small current capacity, compared to the transistor 5-1. Namely, the current sensing means formed of the transistors 4-2 and 5-2 senses a sufficiently small current at which the power semiconductor element 1-1 can be deemed as turned-off. It was stated that in the embodiment of FIG. 2, currents are not allowed to flow through the transistors 3 and 4 unless the voltage at the control terminal of the transistor 3 exceeds the predetermined threshold value. In the embodiment of FIG. 6, the above-mentioned depletion mode MOSFETs are used to bring the threshold voltage below zero and to enable sensing of sufficiently small currents.

When the current which the transistor 4-2 can allow to flow becomes small compared to the current which the transistor 5-2 can allow to flow, a high level voltage is inputted to the inverter 16-2. This signal is inputted to the AND circuit 18 through the inverter 17-2 and the level shift means 46. Another input of the AND circuit 18-2 is a drive signal of high level supplied from the control circuit 20 for turning on the power semiconductor element 1-2. Namely, even when a drive signal for turning on the power semiconductor element with the detection of the excessive current in the power semiconductor element.

Figure 7:
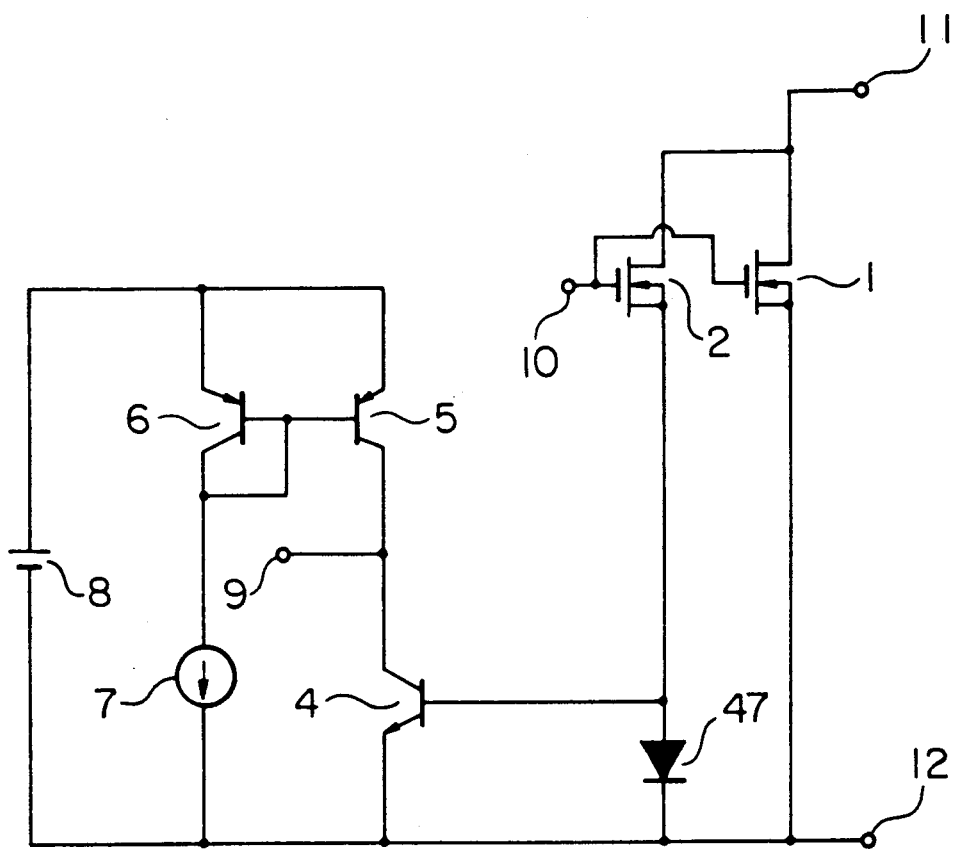
FIG. 7 is a circuit diagram of a fifth embodiment of a current sensing circuit according to this invention.

FIG. 7 shows another embodiment of this invention. The construction of FIG. 7 is similar to that of FIG. 2 except the point that the transistor 3 is replaced with a diode 47. Explanations of the similar construction is dispensed with. In the current mirror circuit comprising the transistors 3 and 4 in FIG. 2, the transistor 3 has its collector and its base short-circuited and hence substantially shows the characteristics of a diode. Thus, a similar current sensing function as that of FIG. 2 can be afforded by using a diode 47 having substantially the similar characteristics as those of the 1-2 is sent from the control circuit, the command of turning on the power semiconductor element 1-2 is not executed unless the current sensing means formed of the transistors 4-2 and 5-2 confirms that the power semiconductor element 1-2 has been turned off for preventing short-circuiting.

The operation of the transistors 4-4 and 5-4 in the lower stage circuit for driving the power semiconductor element 1-2 is similar to the above and the explanation thereof is dispensed with.

As is described above, the function of protecting from the short-circuiting of the inverter can be afforded at the same time base-emitter route of the transistor 4 in place of the above-mentioned transistor 3.

Figure 8:
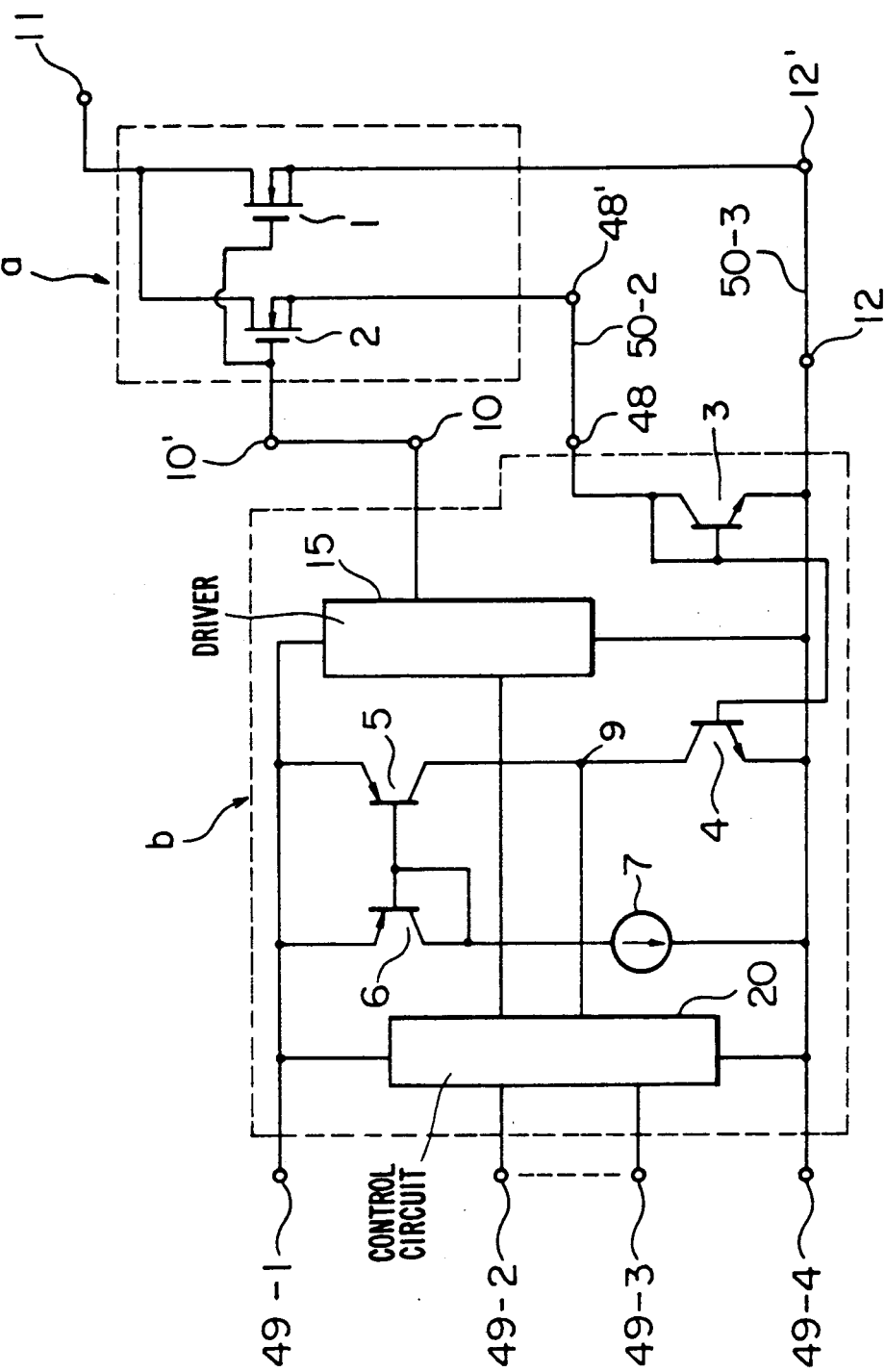
FIG. 8 is a circuit diagram of a sixth embodiment according to this invention.

FIG. 8 shows an embodiment in which a current sensing circuit according to this invention is formed on a same semiconductor substrate together with other drive circuit or circuits 15, control circuit or circuits 20 to form an IC. Transistors 3 to 6 which form a current sensing and current comparison means will basically form current mirror circuits, so that it is desirable that the transistors 3 and 4, and the transistors 5 and 6 are respectively transistors of the same characteristics formed through the same manufacturing processes. This is achieved by integrating these transistors in a same chip. At the same time, the number of parts can be reduced by incorporating the drive circuit 15 and/or the control circuit 20 in the same IC. By these reasons, the region b enclosed in a broken line is formed into an IC. The IC of the region b is provided with terminals 10, 12, 48 and 49. It is possible to form the semiconductor elements 1 and 2 in a same semiconductor substrate as power semiconductor elements of multi-outputs having output terminals 12' and 48'. This is represented by a region a enclosed in a broken line. The region b of an integrated configuration and the region a of the power semiconductor elements are connected by connecting terminals 10 and 10', 48 and 48', and 12 and 12' with the respective wirings 50.

The circuit operation of this embodiment is similar to that of the embodiment shown in FIG. 3, and the explanation thereof is dispensed with. It is an effective way for improving the precision of current sensing to integrate the current sensing means and the current comparison means as in this embodiment.

In this embodiment, the IC region b and the power semiconductor element region a are formed in respective semiconductor chips of different semiconductor substrates and are connected by wirings. Also in the case where the region a and the region b are discretely formed in a same semiconductor substrate, i.e. in the configuration of so-called power IC, the precision of current sensing is similarly good as in the embodiment of FIG. 8 and further there is an advantage that the number of parts can be reduced.

Figure 9:
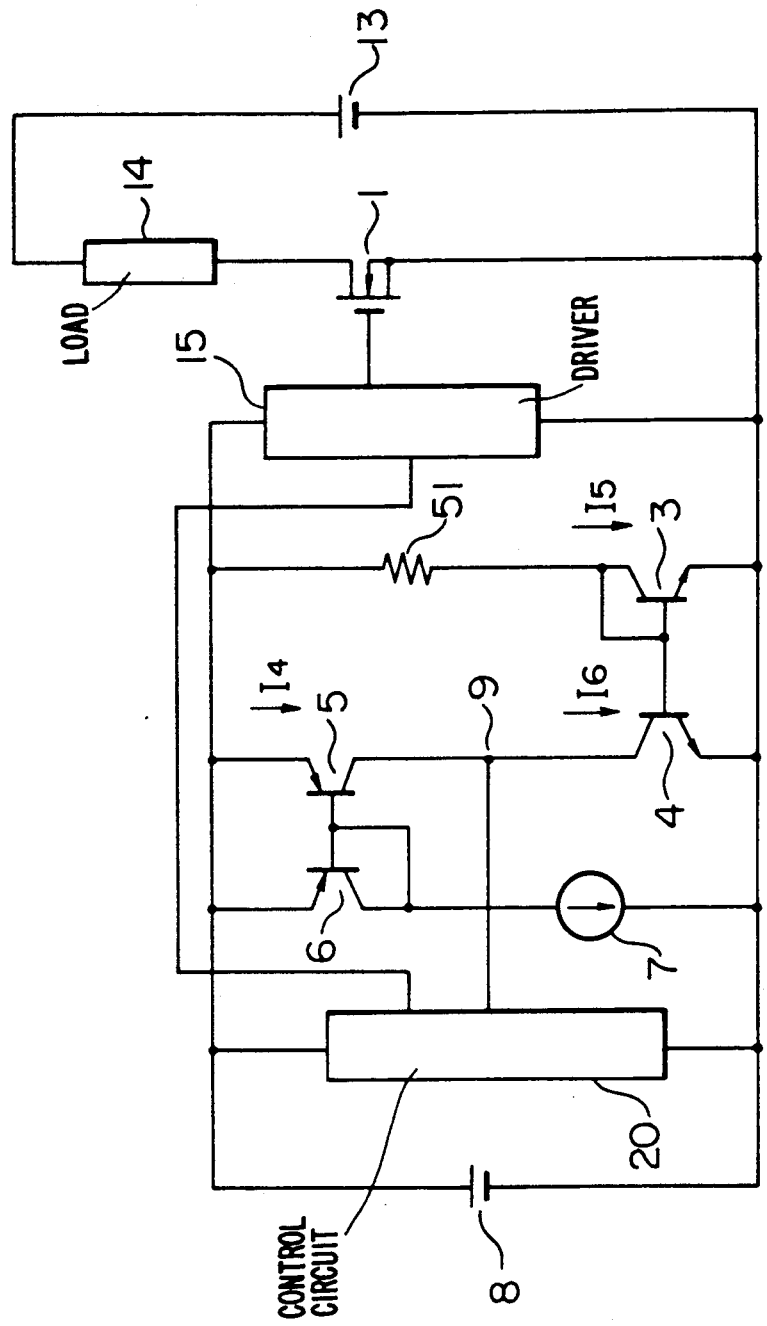
FIG. 9 is a circuit diagram of a seventh embodiment according to this invention.

FIG. 9 shows an embodiment in which the current comparison means which is a feature of this invention is applied to temperature sensing. In FIG. 9, transistors 3 and 4 form a current mirror circuit and transistors 5 and 6 form another current mirror circuit. At the same time, it is the same as the embodiment of FIG. 2 to constitute a current comparison means with the transistors 4 and 5. Also, it is the same as the embodiment of FIG. 2 that a reference current $I_4$ can be supplied to the transistor 5 by the constant current source means 7. Here a resistor means 51 is connected to the transistor 3 and a function for allowing a current $I_5$ defined by the following equation to flow through the transistor 3 is provided.

$$I_5 = (V_{cc} - V_{on})/R(T) \quad (3)$$

In this equation, $V_{cc}$ represents the voltage of the voltage source 8, $V_{on}$ represents the on-voltage of the transistor 3, and R(T) represents the resistance value of the resistor means 51, where R(T) increases depending on the temperature increase.

The reference current is set to satisfy $I_4 < I_6$ to obtain a low level voltage from the output 9 in the room temperature state. Next, when the temperature rises, the current $I_5$ decreases from the relation of equation (3). Similarly, the current $I_6$ decreases. When the resistance R(T) is set to realize the relation $I_4 > I_6$ when the temperature rises to that state in which the normal operation of the semiconductor element 1 becomes difficult, a high level voltage is obtained from the output 9 in such a state. Then, the control circuit 20 senses the change that the output 9 becomes of high level and controls the drive circuit to turn off the power semiconductor element 1. In this way, protection from the temperature rise can be performed. Although the current $I_5$ which changes depending on the temperature rise is formed from the resistor means R(T) in this embodiment, it is not limited to this manner and can also be made by other means.

According to this invention, there is provided a current sensing circuit for a power semiconductor element which is less influenced by the characteristics dispersion during the manufacture and the temperature change.

Also, according to this invention the current sensing circuit has a variety of usage and enables sensing of multi-purpose states, enabling effective protection of the power semiconductor element by the use of these properties. The effects in the application and utilization are also significant.

We claim:

1. A current sensing circuit for a semiconductor circuit having a first semiconductor element forming a series circuit including a first external power source and an external load, wherein said first semiconductor element includes means to control a flow and cut-off of a load current through said external load, and a second semiconductor element having a smaller size than the first semiconductor element and allowing a second current to flow which is smaller than the load current and which varies depending on the load current, said current sensing circuit comprising:

means for taking out a current which is connected to the second semiconductor element to take out the second current, said means including a first current mirror circuit having at least two transistors;

means including a second current mirror circuit having at least two transistors;

means for setting a reference current to allow a predetermined reference current to flow in said second current mirror circuit;

current comparison means including a series circuit of one of said transistors of the first current mirror circuit and one of said transistors of the second mirror circuit, and an output terminal provided therebetween from which a state signal showing a result of the comparison between the second current and the reference current is outputted;

means for connecting said current comparison means to a second external power source having a lower voltage than said first external power source; and current sensing means for sensing a value of the load current flowing in said first semiconductor based on the output of said current comparison means.

2. A current sensing circuit for a semiconductor element according to claim 1, wherein one of said two transistors of said means for taking out a current is coupled in series with said second semiconductor element.

3. A protection circuit for protecting a semiconductor circuit including a current sensing circuit for said semiconductor circuit having a first semiconductor element forming a series circuit including a first external power source and an external load, wherein said first semiconductor element includes means to control a flow and cut-off of a load current through said external load, and a second semiconductor element having a smaller size than the first semiconductor element and allowing a second current to flow which is smaller than the load current and which varies depending on the load current, said current sensing circuit comprising:

means for taking out a current which is connected to the second semiconductor element to take out the second current, said means including a first current mirror circuit having at least two transistors;

means including a second current mirror circuit having at least two transistors;

means for setting a reference current to allow a predetermined reference current to flow in said second current mirror circuit;

current comparison means including a series circuit of one of said transistors of the first current mirror circuit and one of said transistors of the second mirror circuit, and an output terminal provided therebetween from which a state signal showing a result of the comparison between the second current and the reference current is outputted;

means for connecting said current comparison means to a second external power source having a lower voltage than said first external power source; and current sensing means for sensing a value of the load current flowing in said first semiconductor based on the output of said current comparison means, wherein said current comparison means outputs a high level signal when said second current flowing is said first current mirror circuit is smaller than said reference current or a low level signal when said second current is equal to or higher than said reference current, and further comprising means to cut off said first and second semiconductor elements by sensing a change of the output of said current comparison means from the high level to the low level.

4. A protection circuit for protecting a semiconductor element according to claim 3, wherein said first and second semiconductor elements, said means for taking out of a current, said current comparison means and said means to be cut off said first and second semiconductor elements are disposed on a same semiconductor substrate to shorten a signal communication delay among said means and to shorten a protection performance delay.

5. A protection circuit for protecting a semiconductor element according to claim 3, wherein one of said two transistors of said means for taking out a current is coupled in series with said second semiconductor element.

6. A current sensing circuit for a semiconductor circuit having a first semiconductor element forming a series circuit including a first external power source and an external load, wherein said first semiconductor element includes means to control a flow and cut-off of a load current through said external load, and a second semiconductor element having a smaller size than the first semiconductor element and allowing a second current to flow which is smaller than the load current and which varies depending on the load current, said current sensing circuit comprising:

a series circuit including at least a first transistor and a second transistor;

a closed circuit including said series circuit and a second external power source having a lower voltage than said first external power source;

means connected to said first transistor and to said second semiconductor element to allow the second current to flow when a predetermined voltage is applied to a control terminal of said first transistor, said second current varying depending on said load current;

means for allowing a predetermined reference current to flow when a predetermined voltage is applied to a control terminal of said second transistor; and an output terminal provided at an interconnection of said first transistor and said second transistor which output terminal outputs a state signal showing a result of a comparison between said second current and said reference current.

7. A current sensing circuit for a semiconductor circuit according to claim 6, wherein said first transistor is an NPN bipolar transistor and wherein said second transistor is a PNP bipolar transistor.

* * * * *